(12) United States Patent
Shin

(10) Patent No.: US 6,838,915 B2
(45) Date of Patent: Jan. 4, 2005

(54) INPUT AND OUTPUT CIRCUIT OF SEMICONDUCTOR DEVICE

(75) Inventor: Soon-Kyun Shin, Seongnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/670,592

(22) Filed: Sep. 25, 2003

(65) Prior Publication Data

US 2004/0084695 A1 May 6, 2004

(30) Foreign Application Priority Data

Sep. 25, 2002 (KR) .................................. 10-2002-0058250

(51) Int. Cl.[7] .................................................. H03B 1/00

(52) U.S. Cl. ......................................... 327/112; 326/85

(58) Field of Search ................................ 327/108, 112; 326/82–87, 89–91

(56) References Cited

U.S. PATENT DOCUMENTS

| | | | | |
|---|---|---|---|---|
| 5,396,128 A | * | 3/1995 | Dunning et al. | 326/68 |
| 5,933,025 A | * | 8/1999 | Nance et al. | 326/81 |
| 6,028,450 A | * | 2/2000 | Nance | 326/81 |
| 6,043,680 A | * | 3/2000 | Dasgupta | 326/81 |
| 6,064,231 A | | 5/2000 | Kothandaraman et al. | 326/83 |
| 6,081,412 A | | 6/2000 | Duncan | 361/86 |
| 6,150,843 A | * | 11/2000 | Shiffer et al. | 326/80 |
| 6,194,944 B1 | | 2/2001 | Wert | 327/327 |
| 6,266,284 B1 | * | 7/2001 | Kurihara et al. | 365/189.05 |
| 6,333,663 B1 | * | 12/2001 | Lee | 327/333 |
| 6,351,421 B1 | * | 2/2002 | Merritt | 365/189.11 |

* cited by examiner

Primary Examiner—My-Trang Nuton
(74) Attorney, Agent, or Firm—F. Chau & Associates, LLC

(57) ABSTRACT

An input and output circuit of a semiconductor device is disclosed having an output buffer including first and second pull-up transistors connected in series between the power supply voltage and the pad, first and second pull-down transistors connected in series between the pad and the ground voltage, a pre-driver for pulling up or down a voltage of the pad when an output enable signal is enabled and for switching off the first and second pull-up transistors and the first and second pull-down transistors when the output enable signal is disabled, and a first circuit for adjusting voltage differences between respective gates and respective sources/drains of the first and second pull-up transistors and the first and second pull-down transistors to be below a predetermined voltage level in response to the first, second and third control signals under power on or power off conditions; and an input buffer including a transmission gate for transmitting an input signal applied to the pad to a first node in response to the first control signal, third, fourth and fifth pull-up transistors connected in series between the power supply voltage and a second node and having corresponding gates connected to a third node, the pad and the first node, respectively, a third pull-down transistor connected between the second node and the ground voltage and having a gate connected to the first node, a second circuit for adjusting voltage differences between respective gates and respective sources/drains of the third, fourth and fifth pull-up transistors and the third pull-down transistor to be below a predetermined voltage in response to the first and third control signals if the high voltage is applied to the pad under either power on or power off conditions.

25 Claims, 4 Drawing Sheets

INPUT AND OUTPUT CIRCUIT OF SEMICONDUCTOR DEVICE

BACKGROUND OF THE INVENTION

1. Field of the Invention

The present invention relates to a semiconductor device, and more particularly to an input and output circuit of a semiconductor device.

2. Description of the Related Art

As semiconductor device fabrication technologies are advanced to implement deep-submicron lines, power supply voltages of semiconductor devices are lowered to 3.3V or below, but systems utilizing such semiconductor devices operating at or below 3.3V still operate at a higher voltages, such as 5V.

Generally, an input and output circuit of a semiconductor device comprises an input buffer connected to an input pad for buffering an input signal input from an input pad and an output buffer connected to an output pad for buffering an output signal output from an internal circuit of a semiconductor device and outputting the buffered signal to an output pad.

An input buffer and an output buffer of a conventional semiconductor device perform a tolerance function under power on conditions of the device, but do not perform a tolerance function under power off conditions of the device. Accordingly, in the case where a high voltage is input to the input and the output buffers of the device under power off conditions of the device, a conventional input buffer and output buffer are disadvantageous in that gate oxides of MOS transistors in the input and the output buffers of the device may be damaged from high voltage differences between gates and sources/drains of the MOS transistors composing the input and the output buffers. In addition, a conventional semiconductor device has a disadvantage in that leakage current flows through the MOS transistors in the input and the output buffers under power on and off conditions of the device.

Accordingly, it is desirable to provide an input and output circuit of a semiconductor device having a tolerance function for making the semiconductor device stably operate even when a high voltage higher than an internal power supply voltage of the semiconductor device is input to the device.

SUMMARY OF THE INVENTION

It is a feature of an embodiment of the present invention to provide an input and output circuit of a semiconductor device, capable of performing a tolerance function upon both power on and power off conditions.

It is another feature of an embodiment of the present invention to provide an input and output circuit of a semiconductor device, capable of preventing leakage current under power on and power off conditions.

In accordance with one aspect of the present invention, there is provided an input and output circuit of a semiconductor device, comprising: a control signal generating means for generating a first control signal of power supply voltage, a second control signal of ground voltage and a third control signal of a high voltage greater than the power supply voltage, respectively, under power on condition of the semiconductor device when the high voltage is applied to a pad of the semiconductor device, and generating the first and the second control signals having substantially the same voltage as power supply voltage and the third control signal of the high voltage, under power off condition of the semiconductor device when the high voltage is applied to the pad of the semiconductor device; an output buffer including a first and second pull-up transistors connected in series between the power supply voltage and the pad, a first and second pull-down transistors connected in series between the pad and the ground voltage, a pre-driver for pulling up or down a voltage of the pad in response to an input signal when an output enable signal is enabled and for switching off the first and second pull-up transistors and the first and second pull-down transistors when the output enable signal is disabled, and a first tolerance and current blocking means for adjusting voltage differences between respective gates and respective sources/drains of the first and second pull-up transistors and the first and second pull-down transistors to be below a predetermined voltage level in response to the first, second and third control signals, and preventing current flow from the pad to the power supply voltage if the high voltage is applied to the pad under power on and power off conditions; and an input buffer including a transmission gate for transmitting an input signal applied to the pad to a first node in response to the first control signal, a third, a fourth and a fifth pull-up transistors connected in series between the power supply voltage and a second node and having corresponding gates connected to a third node, the pad and the first node, respectively, a third pull-down transistor connected between the second node and the ground voltage and having a gate connected to the first node, a second tolerance and current blocking means for adjusting voltage differences between respective gates and respective sources/drains of the third, fourth and fifth pull-up transistors and the third pull-down transistor to be below a predetermined voltage in response to the first and third control signals, and preventing current flow from the pad to the power supply voltage if the high voltage is applied to the pad under both power on and power off conditions.

In accordance with another aspect of the present invention, there is provided is an input and output circuit of a semiconductor device, comprising: a control signal generating circuit for generating a first control signal of a power supply voltage level, a second control signal of a ground voltage level and a third control signal of a high voltage level when a the high voltage is applied to a pad of the semiconductor device under power on condition and for generating the first and second control signals of a voltage level similar to the power supply voltage and the third control signal of the high voltage level when the high voltage is applied to the pad under power off condition; and an output buffer including a first and second pull-up transistors connected in series between the power supply voltage and the pad, a first and second pull-down transistors connected in series between the pad and the ground voltage, a pre-driver for pulling up or down a pad voltage of the pad in response to an input signal if an output enable signal is enabled and for switching off the first and second pull-up transistors and the first and second pull-down transistors if the output enable signal is disabled, and a tolerance and current blocking means for adjusting voltage differences between respective gates and respective sources/drains of the first and second pull-up transistors and the first and second pull-down transistors to be below a predetermined voltage in response to the first, second and third control signals, and preventing current flow from the pad to the power supply voltage if the high voltage is applied to the pad under both power on and power off conditions.

Preferably, the tolerance and current blocking means comprises: a first driver including a switching transistor for transmitting the power supply voltage to a first node in response to the second control signal by being turned on under power on condition, a third pull-up transistor connected between the first node and a second node, having a gate connected to the first signal and formed on a semiconductor substrate connected to the third control signal, and a third pull-down transistor connected between the second node and the ground voltage and having a gate connected to the first signal; a second driver including a fourth pull-up transistor and a fourth pull-down transistor connected in series between the power supply voltage and the ground voltage and having corresponding gates connected to the third control signal; a third driver including a backward diode connected between the power supply voltage and a third node, a fifth pull-up transistor connected between the third node and a fourth node, having a gate connected to the second signal and formed on a semiconductor substrate connected to the third control signal, a fifth pull-down transistor connected between a fifth node and the ground voltage and having a gate connected to the second signal, and a first and second transmission transistors connected in series between the fourth node and the fifth node and having corresponding gates connected to the first control signal for transmitting a signal to a sixth node; a first transistor connected between the second node and the first control signal, having a gate connected to the power supply voltage and formed on a semiconductor substrate connected to the third control signal, for making the second node have substantially the same voltage level as the power supply voltage under power off condition; a second transistor connected between the sixth node and the pad, having a gate connected to the first control signal and formed on a semiconductor substrate connected to the third control signal, for transmitting the high voltage applied to the pad to the sixth node; a voltage drop circuit for lowering the high voltage applied through the pad; and a third transistor connected between the common node of the first and second pull-up transistors and the voltage drop circuit, having a gate connected to the second signal and formed on a semiconductor substrate connected to the third control signal, for lowering a voltage of the common node of the first and second pull-up transistors if the high voltage is applied to the pad under power on and power off conditions.

In accordance with a further aspect of the present invention, there is provided an input and output circuit of a semiconductor device, comprising: a control signal generating means for generating a first control signal of power supply voltage, a second control signal of ground voltage and a third control signal of a high voltage greater than the power supply voltage, respectively, if the high voltage is applied to a pad of the semiconductor device under power on condition of the semiconductor device, and generating the first and the second control signals having substantially the same voltage as power supply voltage and the third control signal of the high voltage if the high voltage is applied to a pad of the semiconductor device under power off condition of the semiconductor device; and an input buffer including a transmission gate for transmitting an input signal applied to the pad to a first node in response to the first control signal, a first, a second and a third pull-up transistors connected in series between the power supply voltage and a second node having corresponding gates connected to a third node, the pad and the first node, respectively, a first pull-down transistor connected between the second node and the ground voltage and having a gate connected to the first node, a tolerance and current blocking means for adjusting voltage differences between respective gates and respective sources/ drains of the first, second and third pull-up transistors and the first pull-down transistor to be below a predetermined voltage value in response to the first and second control signals, and preventing current flow from the pad to the power supply voltage if the high voltage is applied to the pad under both power on and power off conditions.

Preferably, the tolerance and current blocking means comprises: a first transistor connected between the third node and the ground voltage and having a gate connected to the power supply voltage, for increasing a voltage level of the third node to the power supply voltage under power on condition; a second and third transistors connected in series between the third node and the first node, having corresponding gates connected to the power supply voltage and formed on a semiconductor substrate connected to the second control signal, wherein a common node thereof is connected to a common node of the first and second pull-up transistors, for transmitting the voltage of the first node to the common node of the first and second pull-up transistors under power off condition; and a fourth transistor connected between the common node of the second and third pull-up transistors and the first node, having a gate connected to the power supply voltage and formed on a semiconductor substrate connected to the second control signal, for transmitting the voltage of the first node to the common node of the second and third pull-up transistors under power off condition.

BRIEF DESCRIPTION OF THE DRAWINGS

The above and other features and advantages of the present invention will become readily apparent to those of ordinary skill in the art by describing in detail preferred embodiments thereof with reference to the attached drawings, in which.

DETAILED DESCRIPTION OF PREFERRED EMBODIMENTS

Figure 1:
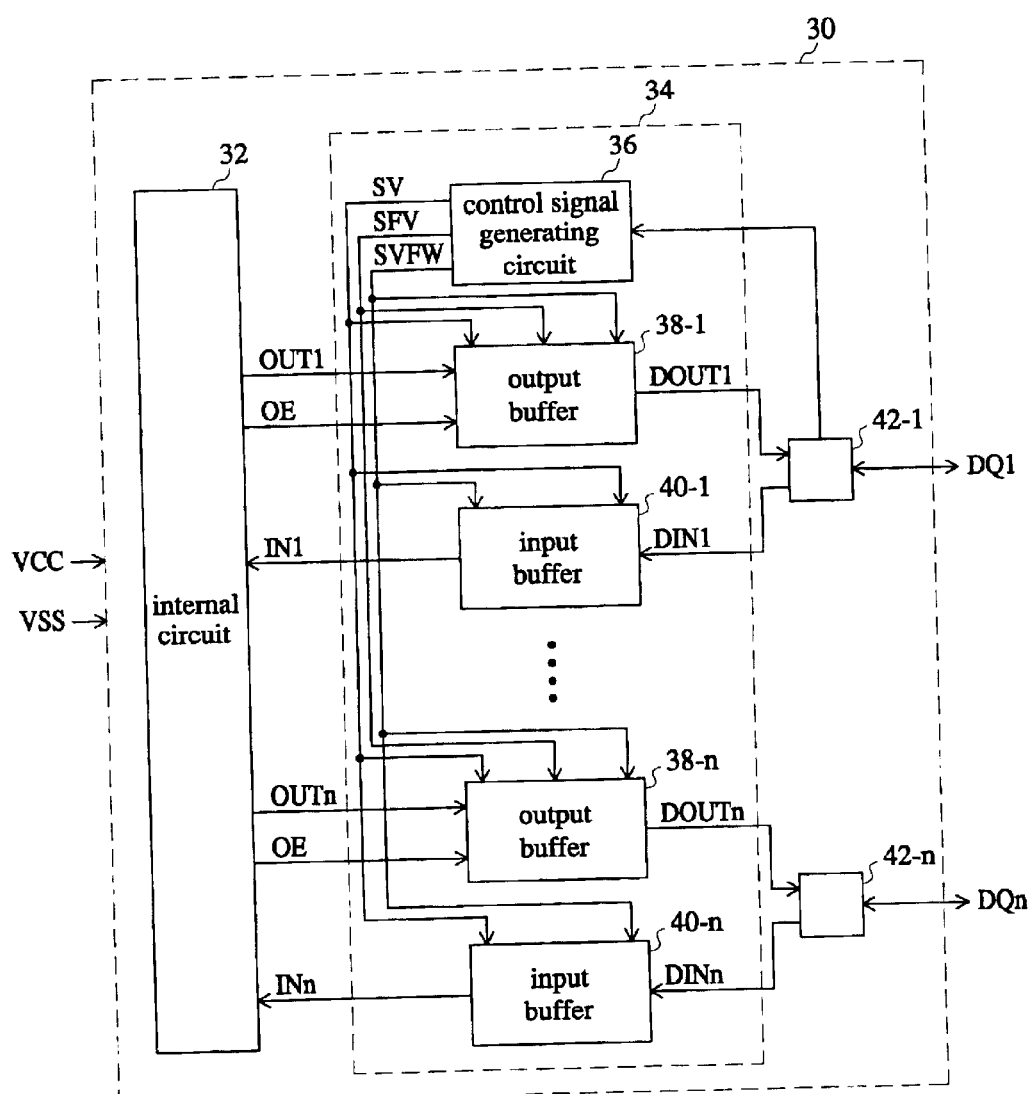
FIG. 1 is a block diagram of an embodiment of a semiconductor device in accordance with the present invention.

Hereinafter, the present invention will be described in detail by describing preferred embodiments thereof with reference to the accompanying drawings, in which like reference numerals refer to like elements.

FIG. 1 is a block diagram illustrating an embodiment of a semiconductor device in accordance with the present invention. Referring to FIG. 1, a semiconductor device 30 comprises an internal circuit 32, an input and output circuit 34 in signal communication with the internal circuit 32, and a plurality of pads 42-1 to 42-n in signal communication with the input and output circuit 34. The input and output circuit 34 comprises a control signal generating circuit 36, output buffers 38-1 to 38-n, and input buffers 40-1 to 40-n.

In FIG. 1, each of the pads 42-1 to 42-n is connected to a corresponding one of the output buffers 38-1 to 38-n and to a corresponding one of the input buffers 40-1 to 40-n. However, each of the pads 42-1 to 42-n can be selectively connected to either a corresponding input buffer 40-1 to 40-n or a corresponding output buffer 38-1 to 38-n.

In FIG. 1, the control signal generating circuit 36 is connected to the pad 42-1, but can be connected to any other pads 42-2 to 42-n. Further, the control signal generating circuit 36 is provided to all pads 42-1 to 42-n for controlling all the input buffers and all the output buffers, but n control signal generating circuits can be provided to the pads 42-1 to 42-n, respectively.

The operation of each circuit block of the semiconductor device shown in FIG. 1 will be described below. The internal circuit 32 performs specific functions of the semiconductor device 30. If the voltage Vp of the pad 42-1 is a high voltage under power on condition, the control signal generating circuit 36 generates a first control signal SV having a power supply voltage VDD and a second control signal SFV having a ground voltage. On the other hand, if the voltage Vp of the pad 42-1 is a high voltage power off condition, the control signal generating circuit 36 generates a first and second control signals SV, SFV having the power supply voltage VDD. Further, if the voltage Vp of the pad 42-1 is the ground voltage under power on condition, the control signal generating circuit 36 generates a third control signal SVFW having the power supply voltage VDD. However, if the voltage Vp of the pad 42-1 is the power supply voltage under power on condition, the control signal generating circuit 36 generates the third control signal of floating state.

Further, if the voltage Vp of the pad 42-1 is a high voltage under power on and off condition, the control signal generating circuit 36 generates the third control signal SVFW of the high voltage. The output buffers 38-1 to 38-n buffers corresponding signals OUT1 to OUTn in response to an output enable signal OE and generates corresponding output signals DOUT1 to DOUTn. Further, the high voltage is applied to the pad 42-1, each output buffer 38-1 to 38-n performs tolerance function to endure the high voltage under power on and off conditions in response to the first through the third control signals SV, SFV, SVFW, and prevents current flow. Each input buffer 40-1 to 40-n buffers input signals DIN1 to DINn and outputs signals IN1 to INn. The input buffers 40-1 to 40-n perform tolerance function to endure the high voltage and prevent current flow in response to the first and third control signals SV, SVFW when the high voltage is applied to the pad 42-1 under power on and power off conditions.

Figure 2:
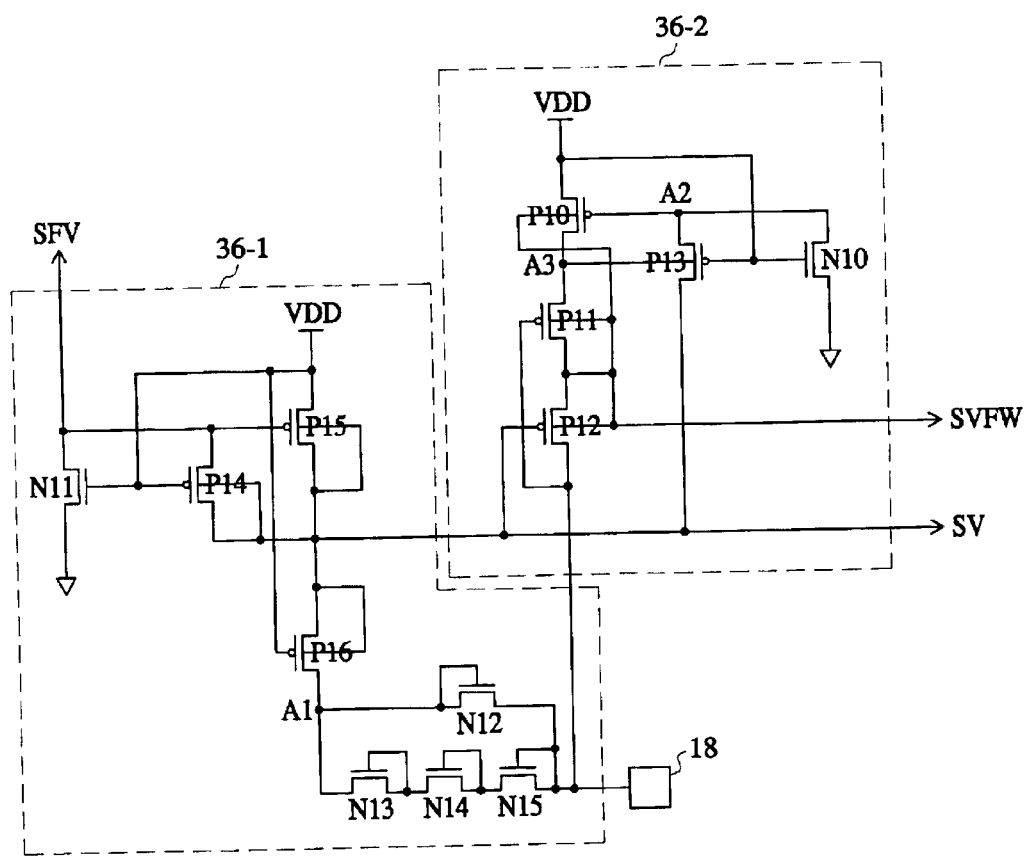
FIG. 2 is a circuit diagram of an embodiment of a control signal generating circuit in accordance with the present invention.

FIG. 2 is a circuit diagram of an embodiment of the control signal generating circuit shown 36 in FIG. 1. Referring to FIG. 2, the control signal generating circuit 36 comprises a first circuit 36-1 for generating the first and the second control signals SV, SVF and a second circuit 36-2 for generating the third control signal SVFW. The first circuit 36-1 comprises PMOS transistors P14, P15 and P16, and NMOS transistors N11, N12, N13, N14 and N15. The second circuit 36-2 comprises PMOS transistors P10, P11, P12 and P13, and an NMOS transistor N10.

In the first circuit 36-1, the PMOS transistors P15 and P16 are connected in series between the power supply voltage VDD and a node A1, have corresponding gates connected to the second control signal SFV and the power supply voltage VDD, respectively, and have a substrate connected to the first control signal SV. The NMOS transistor N11 is connected between the second control signal SFV and the ground voltage, and has a gate to which the power supply voltage VDD is applied. The PMOS transistor P14 is connected between the second control signal SFV and the first control signal SV, has a gate to which the power supply voltage is applied and a substrate connected to the first control signal SV. The NMOS transistors N13, N14 and N15 are connected in series between the node A1 and the pad 18 and act as diodes. The NMOS transistor N12 is connected between the node A1 and the pad 18 and has a gate connected to the node A1.

In the second circuit 36-2, the PMOS transistors P10, P11 and P12 are connected in series between the power supply voltage VDD and the pad 18, have corresponding gates connected to a node A2, the pad 18 and a first control signal SV, respectively, and have a substrate connected to the third control signal SVFW. The PMOS transistor P13 is connected between the node A2 and the first control signal SV, and has a gate connected to the power supply VDD and a substrate connected to a node A3. The NMOS transistor N10 is connected between the node A2 and a ground voltage, and has a gate to which the power supply voltage is applied.

Further, substrates of all PMOS transistors not shown in FIG. 2 are connected to the power supply voltage VDD and substrates of all NMOS transistors not shown in FIG. 2 are connected to the ground voltage.

The operation of the first circuit 36-1 will be described below. Assuming that the semiconductor device operates at 3V of power supply voltage and 5V of a high voltage is applied to the pad 18 under power on condition, then, the NMOS transistor N11 and the PMOS transistor P15 are turned on, and the PMOS transistors P14 and 16 are turned off. Thus, the second control signal SFV having the ground voltage and the first control signal having the power supply voltage VDD are generated. At this time, since the PMOS transistor 16 is turned off, the gate of the PMOS transistor 16 has 3V of voltage and the node A1 maintains 3V due to the NMOS transistors MN13, MN14 and MN 15 acting as diodes. Accordingly, the high voltage of 5V applied to the pad 18 does not affect the first control signal SV. Further, when a voltage of 0V to 5V is applied to the pad 18 under power on condition, the first circuit 36-1 generates the first control signal SV having the ground voltage and the second control signal SFV having the power supply voltage without depending on the voltage level applied to the pad 18 since the PMOS transistor P16 is always turned off.

Next, in the case that the high voltage of 5V is applied to the pad 18 under power off condition in which the power supply voltage VDD becomes the ground voltage, the operation of the first circuit 36-1 will be described below. In this case, the NMOS transistor N11 is turned off and the PMOS transistors P14 and P16 are turned on, so a voltage level of the node A1 is lowered to about 3V from 5V due to the NMOS transistors N13, N14 and N15 acting as diodes. At this time, the first control signal SV and the second control signal SFV become about 3V since the PMOS transistor P16 and the PMOS transistor P14 is turned on. The PMOS transistor P15 is turned off in response to the second control signal SFV.

As a result, under a power on condition, the voltage of the first control signal SV becomes power supply voltage VDD level and the voltage of the second control signal SFV becomes ground voltage level without depending on the external voltage applied to the pad 18. Further, under power off condition, the voltage of the first and second control signals SV, SFV become the power supply voltage VDD as long as the high voltage greater than the power supply voltage VDD is applied to the pad 18. That is, under power off condition, the voltage of the node A1 becomes the power supply voltage VDD by the NMOS transistors N13, N14 and N15 acting as diodes, so the voltage of the first and second control signals SV, SFV becomes the power supply voltage VDD.

The operation of the second circuit 36-2 will be described below. In the case that the ground voltage is applied to the pad 18 of a semiconductor device operating at 3V of power supply voltage under power on condition, the second circuit 36-2 operates as follows:

The NMOS transistor N10 and the PMOS transistor P11 are turned on, and the PMOS transistor P13 is turned off. The NMOS transistor N10 is turned on and a voltage level of the node A2 which is connected to the gate of the PMOS transistor P10 is lowered to the ground voltage. Accordingly, the PMOS transistor P10 is turned on. At this time, since the first control signal SV has the power supply voltage VDD, the PMOS transistor P12 is turned off. Accordingly, the voltage of the third control signal SVFW increases to power supply voltage VDD.

In the case that 3V of voltage is applied to the pad 18 of a semiconductor device operating at 3V of power supply voltage under power on condition, the operation of the second circuit 36-2 will be described below. The NMOS transistor N10 is turned on and the PMOS transistor P11 is turned off. As the NMOS transistor N10 is turned on, the voltage of the node N2 is lowered to the ground voltage and the PMOS transistor P10 is turned on. Further, since the first control signal SV has the power supply voltage VDD, voltage difference between the gate and source of the PMOS transistor P12 is less than a threshold voltage of the PMOS transistor P12, so the PMOS transistor P12 is turned off. Accordingly, the PMOS transistors P11, P12 are turned off and the third control signal SVFW becomes floating state.

In the case that a high voltage 5V is applied to the pad 18 of a semiconductor device operating at 3V of power supply voltage under a power on condition, the second circuit 36-2 operates as follows:

The NMOS transistor N10 is turned on and the PMOS transistor P11 is turned off. The NMOS transistor N10 is turned on and the node A2 becomes the ground voltage. At this time, since the first control signal SV has the power supply voltage VDD, voltage difference between the gate and the source of the PMOS transistor P12 is greater than the threshold voltage of the PMOS transistor P12, so the PMOS transistor P12 is turned on. Accordingly, the voltage level of the third control signal SVFW increases to 5V.

In the case that 5V of a high voltage is applied to the pad 18 under a power off condition in which the power supply voltage is 0V, the second circuit 36-2 operates as follows:

Since the power supply voltage becomes ground voltage level under power off condition, the NMOS transistor N10 is turned off and the PMOS transistor P13 is turned on. At this time, since the first control signal SV has the power supply voltage VDD and the PMOS transistor is turned on, voltage level of the node A2 becomes the power supply voltage VDD and the PMOS transistor P10 is turned off. Further, since a voltage difference between the gate and source of the PMOS transistor P12 is greater than the threshold voltage of the PMOS transistor P12, the PMOS transistor P12 is turned on. Accordingly, the voltage level of the third control signal SVFW increases to 5V.

As a result, under a power on condition, the second circuit 36-2 generates the third control signal SVFW having the power supply voltage VDD when the ground voltage is applied to the pad 18, makes the third control signal SVFW floating when the power supply voltage is applied to the pad 18, and generates the third control signal of 5V when the high voltage 5V is applied to the pad 18. Further, under a power off condition, the second circuit 36-2 generates the third control signal SVFW of 5V when the high voltage 5V is applied to the pad 18. That is, under power on and power off conditions, if a high voltage greater than power supply voltage is applied to the pad 18, the third control signal SVFW increases to the high voltage.

Figure 3:
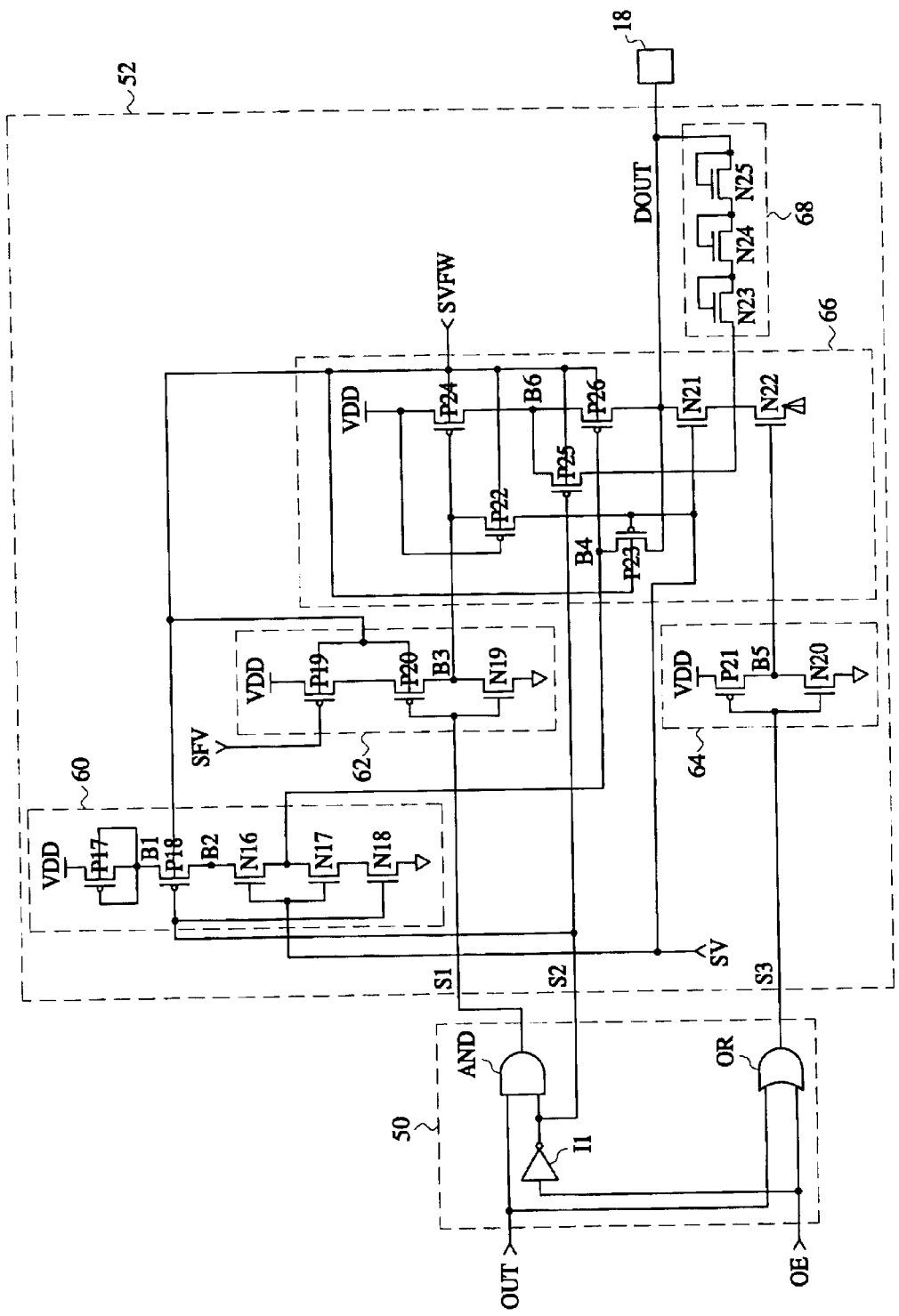
FIG. 3 is a circuit diagram of an embodiment of an output buffer in accordance with the present invention.

FIG. 3 is a circuit diagram illustrating an embodiment of the output buffer shown in FIG. 1. The output buffer comprises a pre-driver 50 having an inverter I1, an AND gate AND, an OR gate OR, and output buffers having PMOS transistors P17 to P26 and NMOS transistors N16 to N25.

The output driver 52 comprises drivers 60, 62 and 64, a pull-up/pull-down driver 66 and a voltage drop circuit 68 which respond to corresponding signals S1, S2 and S3 output from the pre-driver 50.

The driver 60 comprises PMOS transistors P17 and P18 connected in series between the power supply voltage VDD and a node B2, having corresponding gates connected to the node B1 and the signal S2, respectively, and corresponding substrates connected to the node B1 and the third control signal SVFW, respectively. The driver 60 further comprises NMOS transistors N16, N17 and N18 connected in series between the node B2 and the ground voltage and having corresponding gates connected to the first control signal SV, the first control signal SV and the signal S2, respectively.

The driver 62 comprises PMOS transistors P19 and P20 connected in series between the power supply voltage VDD and a node B3, having corresponding gates connected to the second control signal SFV and the signal S1, respectively, and corresponding substrates connected to the third control signal SVFW. The driver 62 further comprises an NMOS transistor N19 connected between the node B3 and the ground voltage, and having a gate connected to the signal S1.

The driver 64 comprises a PMOS transistor P21 and an NMOS transistor N20 connected in series between the power supply voltage VDD and the ground voltage using a node B5 as an intermediate connection node, and having corresponding gates connected to the signal S3.

The pull-up/pull-down driver 66 comprises PMOS transistors P24 and P26 connected in series between the power supply voltage and the pad 18, having corresponding gates connected to the node B3 and B4, respectively, and corresponding substrates connected to the third control signal SVFW. The pull-up/pull-down driver 66 further comprises NMOS transistors N21 and N22 connected in series between the pad 18 and the ground voltage and having corresponding gates connected to the first control signal SV and the node B5, respectively. The pull-up/pull-down driver 66 yet further comprises a PMOS transistor P22 connected between the node B3 and the first control signal SV, having a gate connected to power supply voltage and a substrate connected to the third control signal SVFW. The pull-up/pull-down driver 66 yet further comprises a PMOS transistor P23 connected between the node B4 and the pad 18, having a gate connected to the first control signal SV and a substrate connected to the third control signal SVFW, and a PMOS transistor P25 connected between a node B6 and the voltage drop circuit 68, having a gate to which the signal S2 is applied and a substrate connected to the third control signal SVFW.

The voltage drop circuit 68 comprises NMOS transistors N23, N24, M25 acting as diodes and connected in series to the pad 18. Substrates of the PMOS transistors not shown in FIG. 3 are connected to the power supply voltage VDD, and substrates of the NMOS transistors not shown in FIG. 3 are connected to ground voltage. In FIG. 3, the PMOS transistors P24 and P26, and the NMOS transistors N21 and N22 comprising the pull-up/pull-down driver 66 have greatly larger size than any other transistors.

The operation of the output buffer circuit shown in FIG. 3 will be described below. When the output enable signal OE having ground voltage is input, the AND gate AND and the OR gate OR generate the signals S1 and S3, respectively, wherein the signals S1 and the S3 have substantially the same voltage level as the input signal OUT commonly input to the AND gate AND and the OR gate OR. The inverter I1 generates the signal S2 having the power supply voltage VDD. The output driver 52 generates the output signal DOUT having the power supply voltage VDD in response to the signal S2 having the power supply voltage VDD when the signals S1, S3 have the power supply voltage VDD. Also, the output driver 52 generates the output signal DOUT having the ground voltage when the signals S1, S3 have the ground voltage. That is, the output buffer acts as general signal buffers when the output enable signal OE of the ground voltage level is input.

On the other hand, when the output enable signal OE having the power supply voltage is input, the AND gate AND generates the signal S1 having the ground voltage and the OR gate OR generates the signal S3 having the power supply voltage VDD. The inverter I1 generates the signal S2 having the ground voltage. In such a case, the output signal DOUT output from the output buffer is on high impedance Hi-Z state.

In the case that a high voltage greater than the power supply voltage VDD is applied to the pad 18 under power on and power off conditions, the output buffer circuit shown in FIG. 3 operates as follows:

The operation of the circuit upon the power on condition will be described first. In such case, the signals S1, S2 and S3 have 0V, 0V and 3V, respectively, and the first to third control signals SV, SFV and SFVW have 3V, 0V and 5V, respectively.

The NMOS transistor N20 is turned on, the PMOS transistor P21 is turned off, and a voltage level of the node B5 is lowered to the ground voltage. The PMOS transistors P19 and P20 are turned on, the NMOS transistor N19 is turned off, and the node N3 is pulled up to the power supply voltage VDD level. The PMOS transistor P18 is turned on, the NMOS transistor N18 is turned off, and the NMOS transistors N16 and N17 are turned on. Accordingly, a voltage level of the node B4 which is the power supply voltage VDD is dropped by the sum of threshold voltages of the PMOS transistor P17 and the NMOS transistors N16. The PMOS transistor P22 is turned off, the PMOS transistors P23 and P25 are turned on, and a voltage level of the node B4 finally becomes to about 5V, and a voltage level of a node B6 is drop to about 3V due to the voltage drop circuit 68 from the high voltage applied to the pad 18. Accordingly, voltage difference between gate and source of the PMOS transistor P24 becomes about 0V, voltage difference between gate and drain of the PMOS transistor 26 becomes about 2V, and voltage difference between gate and drain of the NMOS transistor N21 becomes about 2V. Further, voltage difference between gate and drain of the NMOS transistor N22 is less than 3V because source voltage 3V−Vt of the NMOS transistor N21 is applied to the drain of the NMOS transistor N22. Here, the Vt denotes threshold voltage of a NMOS transistor N21. Accordingly, even if a high voltage greater than power supply voltage VDD is applied to the pad 18 under power on condition, voltage differences between gates and sources/drains of the PMOS transistors P24, P26 and the NMOS transistors N21, N22 maintains below a predetermined voltage, so that gate oxides of the PMOS transistors P24, P26 and the NMOS transistors N21, N22 may not be broke down. That is, the output buffer performs tolerance function safely under power on condition.

Next, the operation of the output buffer circuit shown in FIG. 3 under power off condition will be described.

On the power off condition, the signals S1, S2 and S3 have 0V, 0V and 0V of voltage, respectively, and the first to third control signals SV, SFV and SFVW have 3V, 3V and 5V, respectively.

The PMOS transistors P22, P23 and P25 are turned on and a voltage level of node B3 becomes about 3V, a voltage level of the node B4 becomes about 5V, and a voltage level of the node B6 becomes about 3V. Accordingly, voltage difference between gate and drain of the PMOS transistor P24 becomes about 3V, voltage differences between gates and drains of the PMOS transistor P26 and the NMOS transistor N21 become about 2V, voltage difference between gate and drain of the NMOS transistor N22 is less than 3V because the source voltage 3V−Vt of the NMOS transistor N21 is applied to the drain of the NMOS transistor N22. Here, Vt is a threshold voltage of NMOS transistor N21. Accordingly, even a high voltage greater than power supply voltage VDD is applied to the pad 18 under power off condition, voltage differences between gates and sources/drains of the PMOS transistors P24, P26 and the NMOS transistors N21, N22 maintains a voltage lower than a predetermined voltage, so the gate oxides of the PMOS transistors P24, P26 and the NMOS transistors N21, N22 may not be damaged. That is, the output buffer performs tolerance function safely under power off condition. At this time, since voltage of the node B3 is 3V, the PMOS transistor P20 is turned on and current may flow through the PMOS transistor P20 to a power supply voltage VDD source. To prevent such current flow, a PMOS transistor P19 switched off by the second control signal SFV is provided between the power supply voltage VDD and the PMOS transistor P20. Further, under power off condition, since the node B6 is applied 3V voltage, current flows through the voltage drop circuit 68, the PMOS transistor P25 and the PMOS transistor P24 if the PMOS transistor P24 is not turned off. To prevent such current flow, the PMOS transistor P22 may be turned on and 3V voltage is applied to the gate of the PMOS transistor P24, such that the PMOS transistor P24 is turned off, and current flow is blocked.

In the case that 5V of a high voltage is applied to the node B4 under power on and power off conditions, PMOS transistor P17 acting a backward diode prevents current from flowing through the NMOS transistor N16 and PMOS transistor P18.

In the case that 5V of a high voltage is applied to the node B4 under power on and power off conditions, a voltage of the node B4 is transmitted to the PMOS transistor P18 and the NMOS transistor N18 through the NMOS transistors N16 and N17, so the PMOS transistor P18 and the NMOS transistor N18 are protected.

Further, since the third control signal SVFW is applied to substrates of the PMOS transistors P18 to P20 and P22 to P26, current flow from source/drain to substrate is prevented when 5V is applied to the pad 18 under power on and power off conditions.

Figure 4:
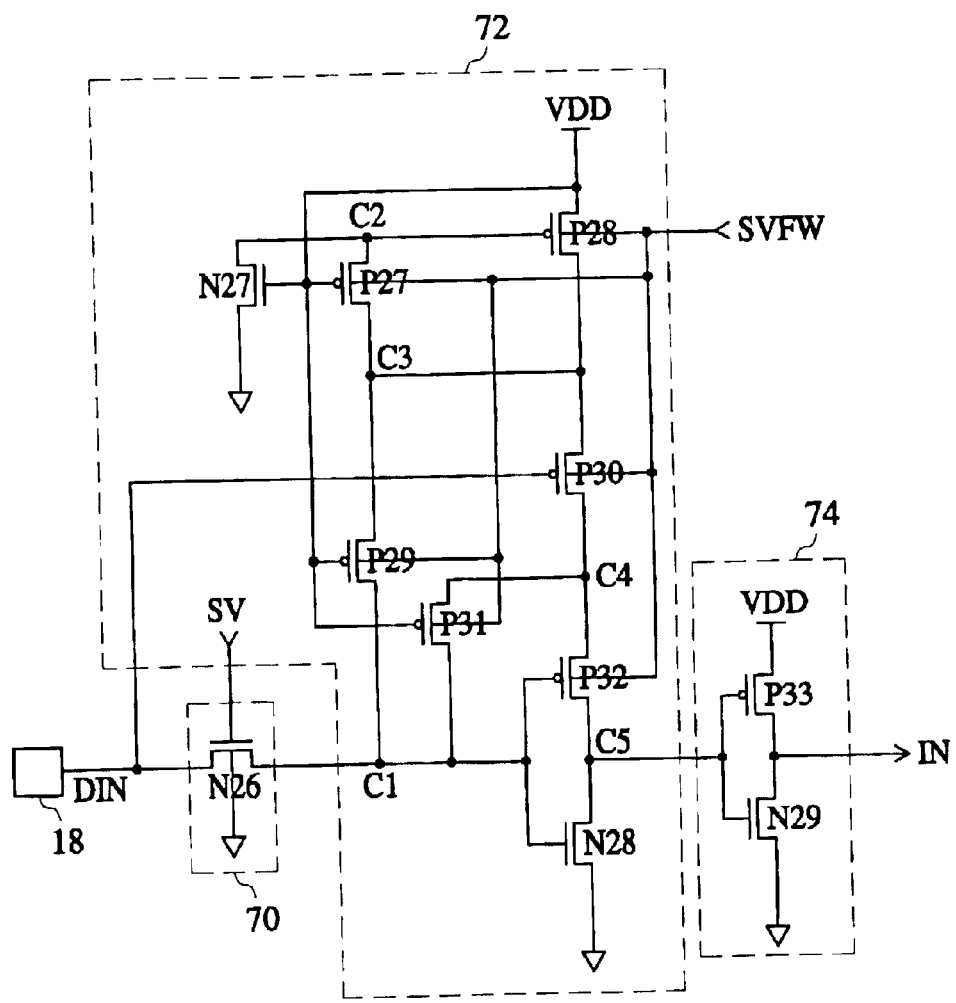
FIG. 4 is a circuit diagram of an embodiment of an input buffer in accordance with the present invention.

FIG. 4 is a circuit diagram of an embodiment of an input buffer in accordance with the present invention. Referring to FIG. 4, the input buffer in accordance with the present invention comprises a transmission gate 70 and inverters 72, 74.

Referring to FIG. 4, the transmission gate 70 have an NMOS transistor N26. The inverter 72 comprises PMOS transistors P27 to P32 and NMOS transistors N27, N28. The inverter 74 comprises a PMOS transistor P33 and an NMOS transistor N29.

In the inverter 72, the PMOS transistors P28, P30 and P32 are connected in series between a power supply voltage VDD and a node C5 using nodes C3 and C4 as intermediate nodes, have corresponding gates connected to a node C2, the pad 18 and a node C1, respectively, and substrates connected to the third control signal SVFW. The NMOS transistor N28 is connected between the node C5 and ground voltage and has a gate connected to the node C1. The PMOS transistors P27 and P29 are connected in series between the node C2 and the node C1 using the node C3 as an intermediate node, have corresponding gates to which power supply voltage VDD is applied, and have corresponding substrates connected to the third control signal SVFW. The NMOS transistor N27 is connected between the node C2 and a ground voltage and has a gate to which power supply voltage is applied. The PMOS transistor P31 is connected between the node C4 and the node C1, has a gate to which power supply voltage is applied and a substrate connected to the third control signal SVFW.

The inverter 74 comprises the PMOS transistor P33 and the NMOS transistor N29 connected in series between the power supply voltage VDD and the ground voltage, and having corresponding gates connected to the node C5.

In FIG. 4, substrates of PMOS transistors not shown are connected to the power supply voltage and substrates of NMOS transistors not shown are connected the ground voltage.

The operation of the input buffer circuit shown in FIG. 4 will be described below.

Under power on condition of a semiconductor device operating at 3V of power supply voltage, if an input signal DIN having a ground voltage or the power supply voltage is applied to the pad 18, the transmission gate 70 and the inverters 72, 74 buffer the input signal DIN having the ground voltage or the power supply voltage VDD and generate a signal IN. In such case, the input buffer shown in FIG. 4 acts as general input signal buffers.

Under power on condition of a semiconductor device operating at 3V of power supply voltage, if an input signal DIN having a high voltage such as 5V is applied to the pad 18, the input buffer operates as follows:

The first and third control signals SV, SVFW have voltage levels of 3V and 5V, respectively. The NMOS transistor N26 transmits a voltage of 2V to the node C1, so the PMOS transistor P28 is turned on and the PMOS transistors P27, P29, P30 and P31 are turned off. Accordingly, since gate voltages of the PMOS transistor P32 and the NMOS transistor N28 are about 2V, gate oxides of the PMOS transistor P32 and the NMOS transistor N28 are not damaged.

On the other hand, under power off condition, i.e. the power supply voltage VDD is 0V, if a high voltage 5V is applied to the pad 18, the input buffer operates as follows:

The first and third control signals SV, SVFW have 3V and 5V, respectively. The NMOS transistor N26 transmits about 2V of voltage to the node C1. The PMOS transistors P27, P29 and P31 are turned on and the PMOS transistors P28 and P30 are turned off. Accordingly, a voltage level of the node C4 becomes about 2V as the same as the voltage level of the node C1.

Accordingly, voltage difference between gate and source of the PMOS transistor P32 is about 0V, and voltage difference between gate and source of the NMOS transistor 28 is about 2V, so gate oxides of the PMOS transistor P32 and the NMOS transistor N28 may not be damaged.

In addition, by switching off the PMOS transistors P30 and P28, current flow to the power supply voltage VDD source may be prevented. Further, since the third control signal SVFW is applied to substrates of the PMOS transistors P27–P32, current flow from sources/drains to substrates of the PMOS transistors P18–P20 and P22–P26 is prevented even when 5V of the high voltage is applied to the pad 18 under both power on and power off conditions.

As described above, the input and output circuit in accordance with the present invention safely performs tolerance function to maintain voltage differences between gates and sources of MOS transistors therein below a predetermined voltage level when a high voltage greater than power supply voltage is applied to a pad connected to the input and output circuit under power on and power off conditions.

Further, the input and output circuit in accordance with the present invention is designed to block all the leakage current paths and to apply a high voltage greater than power supply voltage to substrates of PMOS transistors, so that leakage current does not flow through the input and output circuit.

Preferred embodiments of the present invention have been disclosed herein and, although specific terms are employed, they are used and are to be interpreted in a generic and descriptive sense only and not for the purpose of limitation. Accordingly, it will be understood by those of ordinary skill in the pertinent art that various changes in form and details may be made without departing from the spirit and scope of the present invention as set forth in the following claims.

What is claimed is:

1. An input and output circuit of a semiconductor device, comprising:

a control signal generating means for generating a first control signal of a power supply voltage, a second control signal of a ground voltage and a third control signal of a high voltage greater than the power supply voltage, respectively, when the high voltage is applied to a pad of the semiconductor device under a power on condition of the semiconductor device, and generating the first and the second control signals having substantially the same voltages as the power supply voltage and the third control signal of the high voltage, respectively, when the high voltage is applied to the pad of the semiconductor device under a power off condition of the semiconductor device;

an output buffer including first and second pull-up transistors connected in series between the power supply voltage and the pad, first and second pull-down transistors connected in series between the pad and the ground voltage, a pre-driver for pulling up or down a voltage of the pad in response to an input signal when an output enable signal is enabled and for switching off the first and second pull-up transistors and the first and second pull-down transistors when the output enable signal is disabled, and a first tolerance and current blocking means for adjusting voltage differences between respective gates and respective sources/drains of the first and second pull-up transistors and the first and second pull-down transistors to be below a predetermined voltage level in response to the first, second and third control signals, and preventing current flow from the pad to the power supply voltage if the high voltage is applied to the pad under power on or power off conditions; and an input buffer including a transmission gate for transmitting an input signal applied to the pad to a first node in response to the first control signal, a third, a fourth and a fifth pull-up transistors connected in series between the power supply voltage and a second node and having corresponding gates connected to a third node, the pad and the first node, respectively, a third pull-down transistor connected between the second node and the ground voltage and having a gate connected to the first node, a second tolerance and current blocking means for adjusting voltage differences between respective gates and respective sources/drains of the third, fourth and fifth pull-up transistors and the third pull-down transistor to be below a predetermined voltage in response to the first and third control signals, and preventing current flow from the pad to the power supply voltage if the high voltage is applied to the pad under either the power on or power off conditions.

2. The input and output circuit as set forth in claim 1, wherein the control signal generating means comprises:
   a first circuit for generating the first control signal of the power supply voltage and the second control signal of the ground voltage if the high voltage is applied to the pad under a power on condition, and generating the first control signal and the second control signal which have substantially the same voltage as the power supply voltage if the high voltage is applied to the pad under a power off condition; and
   a second circuit for generating the third control signal of the high voltage if the high voltage is applied to the pad under the power on or power off conditions.

3. The input and output circuit as set forth in claim 2, wherein the first circuit comprises:
   first and second PMOS transistors connected in series between the power supply voltage and a fourth node, having corresponding gates connected to the second control signal and the power supply voltage, respectively, and substrates connected to the first control signal;
   a first NMOS transistor connected between the second control signal and the ground voltage and having a gate connected to the power supply voltage;
   a third PMOS transistor connected between the second control signal and the first control signal, having a gate connected to the power supply voltage, and substrate connected to the first control signal; and
   a first voltage drop circuit for dropping the voltage of the pad down when the voltage of the pad is greater than a voltage of the fourth node.

4. The input and output circuit as set forth in claim 2, wherein the second circuit comprises:
   a fourth, a fifth and a sixth PMOS transistors connected in series between the power supply voltage and the pad, having corresponding gates connected to a fifth node, the pad and the first control signal, respectively, and substrates connected to the third control signal;
   a seventh PMOS transistor connected between the fifth node and the first control signal, having a gate connected to the power supply voltage and a substrate connected to a common node of the fourth and fifth PMOS transistors; and
   a second NMOS transistor connected between the fifth node and the ground voltage and having a gate connected to the power supply voltage.

5. The input and output circuit as set forth in claim 1, wherein the pre-driver generates a first, a second and a third signals for controlling the first tolerance and current blocking means.

6. The input and output circuit as set forth in claim 5, wherein the first tolerance and current blocking means comprises:

a first driver including a switching transistor for transmitting the power supply voltage to a sixth node in response to the second control signal by being turned on under the power on condition, a sixth pull-up transistor connected between the sixth node and a seventh node, having a gate connected to the first control signal and a substrate connected to the third control signal, and a fourth pull-down transistor connected between the seventh node and the ground voltage and having a gate connected to the first signal;
   a second driver including a seventh pull-up transistor and a fifth pull-down transistor connected in series between the power supply voltage and the ground voltage and having corresponding gates connected to the third signal;
   a third driver including a backward diode connected between the power supply voltage and an eighth node, an eighth pull-up transistor connected between the eighth node and a ninth node, having a gate connected to the second signal and a substrate connected to the third control signal, a sixth pull-down transistor connected between a tenth node and the ground voltage and having a gate connected to the second signal, and first and second transmission transistors connected in series between the ninth node and the tenth node and having corresponding gates connected to the first control signal for transmitting a signal to an eleventh node;
   a first transistor connected between the seventh node and the first control signal, having a gate connected to the power supply voltage and a substrate connected to the third control signal, for making the seventh node have substantially the same voltage as the power supply voltage under the power off condition;
   a second transistor connected between the eleventh node and the pad, having a gate connected to the first control signal and formed on a substrate connected to the third control signal, for transmitting the high voltage applied to the pad to the eleventh node under the power on or power off conditions;
   a second voltage drop circuit for lowering the high voltage applied to the pad; and
   a third transistor connected between the common node of the first and second pull-up transistors and the second voltage drop circuit, having a gate connected to the second signal and a substrate connected to the third control signal, for lowering a voltage of the common node of the first and second pull-up transistors if the high voltage is applied to the pad under the power on or power off conditions.

7. The input and output circuit as set forth in claim 6, wherein the switching transistor is a PMOS transistor.

8. The input and output circuit as set forth in claim 6, wherein the backward diode is a PMOS transistor.

9. The input and output circuit as set forth in claim 6, wherein the first and second transmission transistors are NMOS transistors.

10. The input and output circuit as set forth in claim 6, wherein the first, second and third transistors are PMOS transistors.

11. The input and output circuit as set forth in claim 1, wherein the second tolerance and current blocking means comprises:
    a fourth transistor connected between the third node and the ground voltage and having a gate connected to the power supply voltage, for making the third node have the ground voltage under the power on condition;

a fifth and sixth transistors connected in series between the third node and the first node, having corresponding gates connected to the power supply voltage, and substrates connected to the third control signal, wherein a common node thereof is connected to the common node of the third and fourth pull-up transistors, for transmitting a voltage of the first node to the third node and the common node of the third and fourth pull-up transistors under power on condition; and a seventh transistor connected between the common node of the fourth and fifth pull-up transistors and the first node, having a gate connected to the power supply voltage and a substrate connected to the third control signal, for transmitting the voltage of the first node to the common node of the fourth and fifth pull-up transistors.

12. The input and output circuit as set forth in claim 11, wherein the fourth transistor is an NMOS transistor.

13. The input and output circuit as set forth in claim 11, wherein the fifth, sixth and seventh transistors are PMOS transistors.

14. An input and output circuit of a semiconductor device, comprising:

a control signal generating circuit for generating a first control signal of a power supply voltage level, a second control signal of a ground voltage level and a third control signal of a high voltage level when the high voltage is applied to a pad of the semiconductor device under a power on condition and for generating the first and second control signals of a voltage level similar to the power supply voltage and the third control signal of the high voltage level when the high voltage is applied to the pad under a power off condition; and an output buffer including first and second pull-up transistors connected in series between the power supply voltage and the pad, first and second pull-down transistors connected in series between the pad and the ground voltage, a pre-driver for pulling up or down a pad voltage of the pad in response to an input signal if an output enable signal is enabled and for switching off the first and second pull-up transistors and the first and second pull-down transistors if the output enable signal is disabled, and a tolerance and current blocking means for adjusting voltage differences between respective gates and respective sources/drains of the first and second pull-up transistors and the first and second pull-down transistors to be below a predetermined voltage in response to the first, second and third control signals, and preventing current flow from the pad to the power supply voltage if the high voltage is applied to the pad under either the power on or the power off conditions.

15. The input and output circuit as set forth in claim 14, wherein the pre-driver generates first, second and third signals for controlling the tolerance and current blocking means.

16. The input and output circuit as set forth in claim 15, wherein the tolerance and current blocking means comprises:

a first driver including a switching transistor for transmitting the power supply voltage to a first node in response to the second control signal by being turned on under the power on condition, a third pull-up transistor connected between the first node and a second node, having a gate connected to the first signal and a substrate connected to the third control signal, and a third pull-down transistor connected between the second node and the ground voltage and having a gate connected to the first signal;

a second driver including a fourth pull-up transistor and a fourth pull-down transistor connected in series between the power supply voltage and the ground voltage and having corresponding gates connected to the third control signal;

a third driver including a backward diode connected between the power supply voltage and a third node, a fifth pull-up transistor connected between the third node and a fourth node, having a gate connected to the second signal and a substrate connected to the third control signal, a fifth pull-down transistor connected between a fifth node and the ground voltage and having a gate connected to the second signal, and first and second transmission transistors connected in series between the fourth node and the fifth node and having corresponding gates connected to the first control signal for transmitting a signal to a sixth node;

a first transistor connected between the second node and the first control signal, having a gate connected to the power supply voltage and a substrate connected to the third control signal, for making the second node have substantially the same voltage level as the power supply voltage under the power off condition;

a second transistor connected between the sixth node and the pad, having a gate connected to the first control signal and a substrate connected to the third control signal, for transmitting the high voltage applied to the pad to the sixth node;

a voltage drop circuit for lowering the high voltage applied through the pad; and a third transistor connected between the common node of the first and second pull-up transistors and the voltage drop circuit, having a gate connected to the second signal and a substrate connected to the third control signal, for lowering a voltage of the common node of the first and second pull-up transistors if the high voltage is applied to the pad under the power on or power off conditions.

17. The input and output circuit as set forth in claim 16, wherein the switching transistor is a PMOS transistor.

18. The input and output circuit as set forth in claim 16, wherein the backward diode is a PMOS transistor.

19. The input and output circuit as set forth in claim 16, wherein the first and second transmission gates are NMOS transistors.

20. The input and output circuit as set forth in claim 16, wherein the first, the second and the third transistors are PMOS transistors.

21. An input and output circuit of a semiconductor device, comprising:

a control signal generating means for generating a first control signal of power supply voltage, a second control signal of ground voltage and a third control signal of a high voltage greater than the power supply voltage, respectively, if the high voltage is applied to a pad of the semiconductor device under a power on condition of the semiconductor device, and generating the first and the second control signals having substantially the same voltage as power supply voltage and the third control signal of the high voltage if the high voltage is applied to the pad of the semiconductor device under a power off condition of the semiconductor device; and an input buffer including a transmission gate for transmitting an input signal applied to the pad to a first node in response to the first control signal, first, second and third pull-up transistors connected in series between the power supply voltage and a second node having corresponding gates connected to a third node, the pad and the first node, respectively, a first pull-down transistor connected between the second node and the ground voltage and having a gate connected to the first node, a tolerance and current blocking means for adjusting voltage differences between respective gates and respective sources/drains of the first, second and third pull-up transistors and the first pull-down transistor to be below a predetermined voltage value in response to the first and second control signals, and preventing current flow from the pad to the power supply voltage if the high voltage is applied to the pad under either the power on or power off conditions.

22. The input and output circuit as set forth in claim 21, wherein the tolerance and current blocking means comprises:

a first transistor connected between the third node and the ground voltage and having a gate connected to the power supply voltage, for increasing a voltage level of the third node to the power supply voltage under the power on condition;

a second and third transistors connected in series between the third node and the first node, having corresponding gates connected to the power supply voltage and formed on a semiconductor substrate connected to the second control signal, wherein a common node thereof is connected to a common node of the first and second pull-up transistors, for transmitting the voltage of the first node to the common node of the first and second pull-up transistors under the power off condition; and a fourth transistor connected between the common node of the second and third pull-up transistors and the first node, having a gate connected to the power supply voltage and a substrate connected to the second control signal, for transmitting the voltage of the first node to the common node of the second and third pull-up transistors under the power off condition.

23. The input and output circuit as set forth in claim 21, wherein the first circuit is an NMOS transistor.

24. The input and output circuit as set forth in claim 21, wherein the second, third and fourth transistors are PMOS transistors.

25. An input and output circuit of a semiconductor device, the circuit comprising:

a control signal generating portion for generating a first control signal of a power supply voltage level, a second control signal of a ground voltage level and a third control signal of a high voltage level when the high voltage is applied to a pad of the semiconductor device under a power on condition and for generating the first and second control signals of a voltage level similar to the power supply voltage and the third control signal of the high voltage level when the high voltage is applied to the pad under a power off condition; and at least one output buffer comprising at least one pull-up transistor connected between the power supply voltage and the pad, at least one pull-down transistor connected between the pad and the ground voltage, and a tolerance and current blocking portion for adjusting voltage differences between respective gates and respective sources/drains of the at least one pull-up transistor and the at least one pull-down transistor to be below a predetermined voltage in response to the first, second and third control signals, and preventing current flow from the pad to the power supply voltage if the high voltage is applied to the pad under either the power on or the power off conditions.

* * * * *